(12) United States Patent
Choi et al.

(10) Patent No.: US 10,763,455 B2
(45) Date of Patent: Sep. 1, 2020

(54) ELECTROLUMINESCENT DISPLAY DEVICE

(71) Applicant: LG Display Co., Ltd., Seoul (KR)

(72) Inventors: WonJin Choi, Seoul (KR); GeeSung Chae, Incheon (KR); JiGon Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/049,116

(22) Filed: Jul. 30, 2018

(65) Prior Publication Data

US 2019/0067644 A1 Feb. 28, 2019

(30) Foreign Application Priority Data

Aug. 30, 2017 (KR) .................. 10-2017-0109987

(51) Int. Cl.
| | | |
|---|---|---|
| *H01L 51/52* | (2006.01) | |
| *H01L 27/32* | (2006.01) | |
| *G06F 3/044* | (2006.01) | |
| *G06F 3/041* | (2006.01) | |
| *G02B 5/02* | (2006.01) | |
| *G02B 5/30* | (2006.01) | |

(52) U.S. Cl.
CPC .......... *H01L 51/5271* (2013.01); *G06F 3/041* (2013.01); *G06F 3/044* (2013.01); *H01L 27/323* (2013.01); *H01L 27/3246* (2013.01); *H01L 51/5268* (2013.01); *H01L 51/5281* (2013.01); *G02B 5/0242* (2013.01); *G02B 5/30* (2013.01); *H01L 51/5253* (2013.01)

(58) Field of Classification Search
CPC ............. H01L 51/5271; H01L 51/5268; H01L 51/5281; H01L 27/3246; H01L 27/323; H01L 51/5253; G06F 3/044; G06F 3/041; G02B 5/30; G02B 5/0242
See application file for complete search history.

(56) References Cited

U.S. PATENT DOCUMENTS

| | | | |
|---|---|---|---|
| 8,822,998 B2* | 9/2014 | Kim | ...................... H01L 27/326 257/59 |
| 9,583,739 B2* | 2/2017 | Hirakata | ............. H01L 51/5281 |
| 9,692,014 B2* | 6/2017 | Ito | ........................ H01L 27/3258 |
| 2004/0017153 A1 | 1/2004 | Nishikawa | |
| 2016/0043336 A1* | 2/2016 | Kim | ...................... H01L 27/323 257/40 |

(Continued)

FOREIGN PATENT DOCUMENTS

| | | |
|---|---|---|
| KR | 10-0564197 B1 | 3/2006 |
| KR | 10-2013-0105772 A | 9/2013 |
| KR | 10-2016-0066650 A | 6/2016 |

*Primary Examiner* — David Vu
(74) *Attorney, Agent, or Firm* — Polsinelli PC

(57) ABSTRACT

Disclosed herein is an electroluminescent display device. The electroluminescent display device includes: a substrate; a plurality of anodes disposed on the substrate; a bank disposed over the substrate and the plurality of anodes, the bank comprising a plurality of openings each exposing a part of the respective anodes, and one or more holes formed between the openings; a plurality of emission layers on each of the anodes; and a plurality of cathodes on each of the emission layers. It is possible to suppress the color mixing occurring when light emitted from a electroluminescent element is reflected to another emission area for representing a different color rather than its emission area.

20 Claims, 11 Drawing Sheets

(56) References Cited

U.S. PATENT DOCUMENTS

2016/0155784 A1* 6/2016 Park .................... H01L 27/3246
257/88
2016/0306472 A1* 10/2016 Park ..................... G06F 3/0412

* cited by examiner

ELECTROLUMINESCENT DISPLAY DEVICE

CROSS REFERENCE TO RELATED APPLICATION

This application claims the priority of Korean Patent Application No. 10-2017-0109987 filed on Aug. 30, 2017, in the Korean Intellectual Property Office, the disclosure of which is incorporated herein by reference in its entirety.

BACKGROUND

Field of the Disclosure

The present disclosure relates to an electroluminescent display device, and more particularly, to an electroluminescent display device capable of increasing out-coupling efficiency of light emitted from an electroluminescent element and suppressing light emitted from an electroluminescent element from being mixed with light emitted from another electroluminescent element.

Description of the Background

An electroluminescent display device is capable of producing light in its own and thus does not require any additional light source, unlike a liquid-crystal display (LCD) device. Therefore, an electroluminescent display device can be made lighter and thinner than an LCD device. Further, an electroluminescent display device has advantages in that it can be driven with low voltage to consume less power, and in that it represents vivid colors and has short response time, wide viewing angle and good contrast ratio (CR). For these reasons, an electroluminescent display device is currently under development as the next generation display device.

The light emitted from the emission layer of the electroluminescent display device passes through various elements of the electroluminescent display device and exits out of the electroluminescent display device. However, some of the light emitted from the emission layer fail to exit out of the electroluminescent display device and are confined therein due to total reflection. This can decrease the out-coupling efficiency of the electroluminescent display device.

In addition, in the electroluminescent display device, light emitted from an electroluminescent element can be reflected inside the electroluminescent display device toward an adjacent emission area emitting light of a different color rather than its emission area, such that color mixing can occur.

SUMMARY

The inventors of the application have recognized a problem that some of the light emitted from an emission layer of an electroluminescent display device fail to exit out of the electroluminescent display device due to total reflection and are confined therein. In addition, the inventors of the application have recognized a problem that when light emitted from an electroluminescent element disposed in an emission area is totally reflected inside the electroluminescent display device and travels to an adjacent emission area, color mixing may occur.

In view of the above, the inventors of the application have devised an electroluminescent display device having a novel structure that can increase the out-coupling efficiency and suppress color mixing.

In addition, the present disclosure is to provide an electroluminescent display device that can improve the out-coupling efficiency of light emitted from an electroluminescent element.

Further, the present disclosure is to provide an electroluminescent display device that can suppress color mixing which occurs when light emitted from an electroluminescent element is reflected toward an adjacent emission area for emitting light of a different color rather than its emission area.

It should be noted that the present disclosure are not limited to the above-described objects, and other objects of the present disclosure will be apparent to those skilled in the art from the following descriptions.

According to an aspect of the present disclosure, there is provided an electroluminescent display device including: a substrate; a plurality of anodes disposed on the substrate; a bank disposed over the substrate and the plurality of anodes, the bank comprising a plurality of openings each exposing a part of the respective anodes, and one or more holes formed between the openings; a plurality of emission layers on each of the anodes; and a plurality of cathodes on each of the emission layers. It is possible to suppress the color mixing occurring when light emitted from a electroluminescent element is reflected to another emission area for representing a different color rather than its emission area.

According to another aspect of the present disclosure, there is provided an electroluminescent display device comprising: a substrate having a plurality of emission areas; a plurality of electroluminescent elements each disposed on the substrate in the respective emission areas, each of the electroluminescent elements comprising an anode, an emission layer on the anode, and a cathode on the emission layer; a bank disposed to cover a part of the anode to define each of the emission areas and comprising a plurality of first patterns; an encapsulation layer covering the electroluminescent elements and comprising an inorganic layer and an organic layer stacked on one another, the encapsulation layer comprising a plurality of second patterns in an upper surface thereof; and a cover glass disposed on the encapsulation layer, wherein the plurality of first patterns comprises one or more holes to suppress color mixing between the emission areas.

According to another aspect of the present disclosure, there is provided an electroluminescent display device, comprising: a plurality of emission areas defined on a substrate and each emitting single color light; an electroluminescent element corresponding to each of the plurality of emission areas; a color mixing inhibiting trench surrounding the electroluminescent element preventing the emitted single color light from being mixed with other single color light emitted from adjacent emission areas; and a total reflection prevention layer disposed over the color mixing inhibiting trench and making light incident on the total reflection prevention layer exit at an angle greater than an incidence angle.

The details of one or more aspects of the subject matter described in this specification are set forth in the accompanying drawings and the description below.

According to an exemplary aspect of the present disclosure, light emitted from an electroluminescent element can be utilized more efficiently, so that the efficiency and power consumption of an electroluminescent display device can be improved.

According to an exemplary aspect of the present disclosure, the reliability of an electroluminescent display device can be improved and vivid images can be achieved by suppressing color mixing of lights emitted from electroluminescent elements disposed in sub-pixels for representing different colors.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
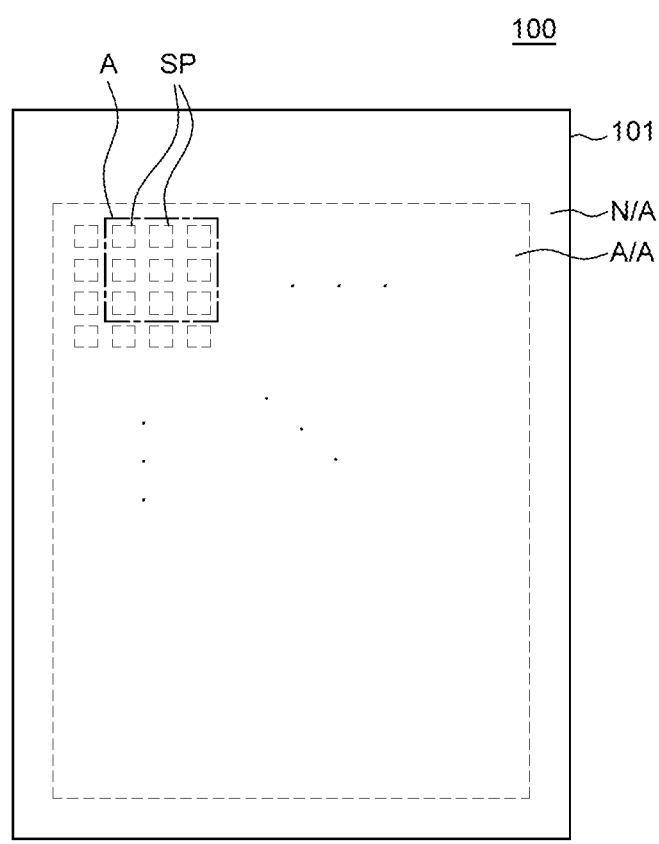
FIG. 1 is a plan view of an electroluminescent display device according to an exemplary aspect of the present disclosure.

Advantages and features of the present disclosure and methods to achieve them will become apparent from the descriptions of exemplary aspects hereinbelow with reference to the accompanying drawings. However, the present disclosure is not limited to exemplary aspects disclosed herein but may be implemented in various different ways. The exemplary aspects are provided for making the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

As used herein, the terms first, second, etc., are used for distinguishing between similar elements and not necessarily for describing a sequential or chronological order. These terms are used to merely distinguish one element from another. Accordingly, as used herein, a first element may be a second element within the technical scope of the present disclosure.

Like reference numerals denote like elements throughout the descriptions.

The drawings are not to scale and the relative dimensions of various elements in the drawings are depicted schematically and not necessarily to scale.

Features of various exemplary aspects of the present disclosure may be combined partially or totally. As will be clearly appreciated by those skilled in the art, technically various interactions and operations are possible. Various exemplary aspects can be practiced individually or in combination.

Hereinafter, an electroluminescent display device according to an exemplary aspect of the present disclosure will be described in detail with reference to the accompanying drawings.

FIG. 1 is a plan view of an electroluminescent display device according to an exemplary aspect of the present disclosure. For convenience of illustration, FIG. 1 shows only a substrate 101 and sub-pixels SP among a variety of elements of an electroluminescent display device 100.

The substrate 101 supports various other elements of the electroluminescent display device 100. The substrate 101 may be formed of an insulating material. For example, the substrate 101 may be formed of a plastic material such as polyimide (PI).

Referring to FIG. 1, the substrate 101 includes an active area A/A and a non-active area N/A.

The active area A/A is defined as an area for displaying an image, in which a plurality of sub-pixels is disposed. In the active area AA, the sub-pixels SP for displaying images and circuitry for driving the sub-pixels SP may be disposed. The circuitry may include a variety of thin-film transistors, capacitors and wirings for driving the sub-pixels SP. For example, the circuitry may include, but is not limited to, a driving thin-film transistor, a switching thin-film transistor, a storage capacitor, a gate line, a data line, and the like. It is, however, to be understood that the present disclosure is not limited thereto.

The non-active area N/A is defined as an area where no image is displayed, and where a variety of driving elements for driving the plurality of sub-pixels SP in the active area A/A may be disposed. For example, a driving circuit, a gate driver IC, a data driver IC and the like may be disposed on the non-active area N/A. It is, however, to be understood that the present disclosure is not limited thereto.

Each of the plurality of sub-pixels SP is an emission area in which an electroluminescent element is disposed. Each of the plurality of sub-pixels SP is capable of individually emitting light of a single color. Several sub-pixels SP may form a single pixel. Each of the plurality of sub-pixels SP may be defined by a bank 140. Hereinafter, the sub-pixels SP and the banks 140 will be described in more detail with reference to FIGS. 2 and 3.

Figure 2:
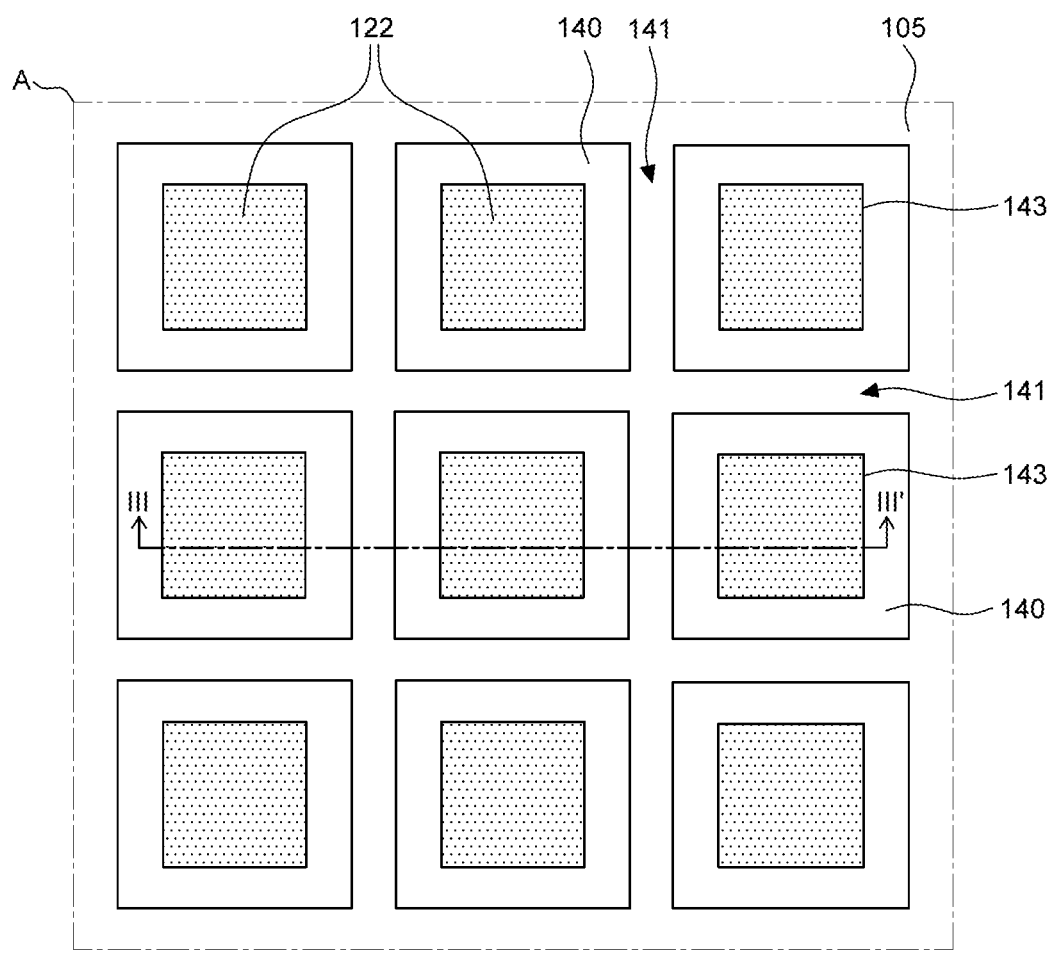
FIG. 2 is an enlarged view of area A of FIG. 1.
Figure 3:
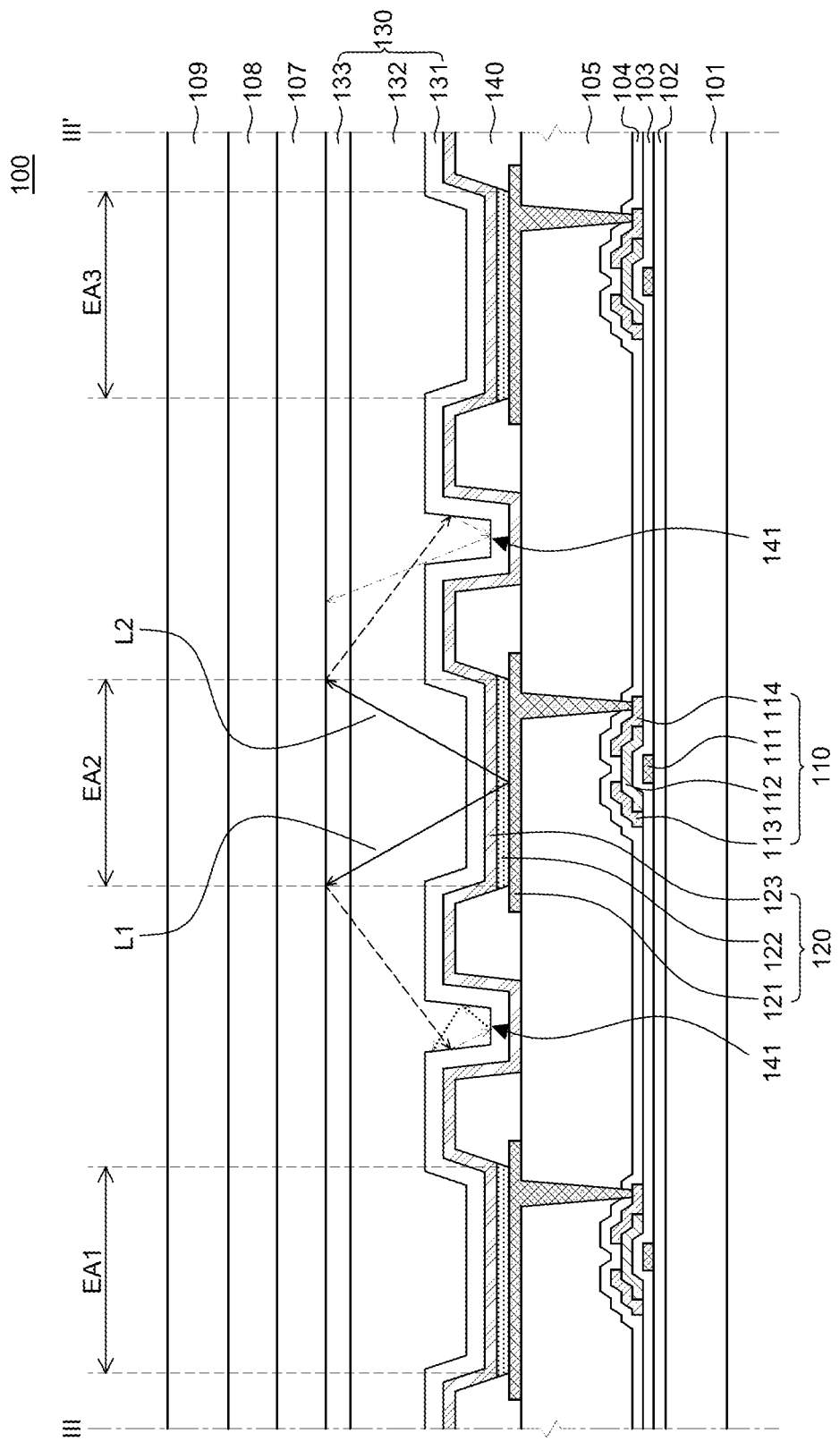
FIG. 3 is a cross-sectional view taken along line III-III' of FIG. 2.

FIG. 2 is an enlarged view of area A of FIG. 1. FIG. 3 is a cross-sectional view taken along line III-III' of FIG. 2, For convenience of illustration, FIG. 2 shows only emission layers 122 of electroluminescent elements 120 and banks 140 disposed in the sub-pixels SP. In addition, it is assumed that the electroluminescent display device 100 is a top-emission electroluminescent display device, in which light generated from the electroluminescent element 120 is emitted toward a cover glass 109.

Referring to FIGS. 2 and 3, the electroluminescent display device 100 includes a substrate 101, a buffer layer 102, a thin-film transistor 110, a gate insulating layer 103, a passivation layer 104, a planarization layer 105, an electroluminescent element 120, a bank 140, an encapsulation layer 130, a touch film 107, a polarizing plate 108, and a cover glass 109.

A buffer layer 102 is disposed on the substrate 101. The buffer layer 102 may prevent permeation of moisture or impurities through the substrate 101. It is to be noted that the buffer layer 102 is not an essential element and may be disposed optionally depending on type of the substrate 101 or the type of the thin-film transistor 110.

The thin-film transistor 110 includes a gate electrode 111, an active layer 112, a source electrode 113, and a drain electrode 114. Although FIG. 3 shows the thin-film transistor 110 as a thin-film transistor having a bottom gate structure in which the gate electrode 111 is disposed under the active layer 112, the present disclosure is not limited thereto.

The gate electrode 111 of the thin-film transistor 110 is disposed on the buffer layer 102. The gate electrode 111 may be formedformed of, but is not limited to, a conductive material, e.g., copper (Cu), aluminum (Al), molybdenum (Mo), titanium (Ti), or an alloy thereof.

The gate insulating layer 103 is disposed on the gate electrode 111. The gate insulating layer 103 is to insulate the gate electrode 112 from the active layer 112 and may be formed of an insulating material. For example, the gate insulating layer 103 may be formed of, but is not limited to, a single layer of silicon oxide (SiOx) or silicon nitride (SiNx), or multiple layers thereof.

The active layer 112 is disposed on the gate insulating layer 103. The active layer 112 may include oxide semiconductor, amorphous silicon, polysilicon, or the like.

The source electrode 113 and the drain electrode 114, which are spaced apart from each other, are disposed on the active layer 112. The source electrode 113 and the drain electrode 114 may be electrically connected to the active layer 112. The source electrode 113 and the drain electrode 114 may be formed of, but is not limited to, a conductive material, e.g., copper (Cu), aluminum (Al), molybdenum (Mo), titanium (Ti), or an alloy thereof.

The passivation layer 104 is disposed on the thin-film transistor 110. The passivation layer 104 is an insulating layer for protecting the thin-film transistor 110. The passivation layer 104 may be formed of, but is not limited to, the same material as the gate insulating layer 103 and may be formed of a single layer of silicon oxide (SiOx) or silicon nitride (SiNx), or multiple layers. In some aspects of the present disclosure, the passivation layer 104 may be eliminated.

The planarization layer 105 is disposed on the passivation layer 104. The planarization layer 105 provides a flat surface over the substrate 101. The planarization layer 105 may be formed of a single layer or multiple layers and may be formed of organic material. For example, the planarization layer 105 may be formed of, but is not limited to, an acryl based organic material. The planarization layer 105 includes a contact hole for electrically connecting the thin-film transistor 110 with the anode 121.

The electroluminescent element 120 is disposed on the planarization layer 105. The electroluminescent element 120 is a self-luminous element that emits light. The electroluminescent element 120 may be driven by the thin-film transistor 110 disposed in each of the sub-pixels SP. The electroluminescent element 120 includes the anode 121, the emission layer 122 and a cathode 123.

The anode 121 is disposed on the planarization layer 105 in each of the sub-pixels SP. The anode 121 is electrically connected to the drain electrode 114 of the thin-film transistor 110 through the contact hole formed in the planarization layer 105 and the passivation layer 104. The anode 121 is formed of a conductive material capable of supplying holes to the emission layer 122. For example, the anode may be formed as a reflective layer formed of, but is not limited to, a transparent conductive material such as tin oxide (TO), indium tin oxide (ITO), indium zinc oxide (IZO) and indium zinc tin oxide (ITZO), and a material having excellent reflectivity such as silver (Ag) and silver alloy (Ag alloy). Although FIG. 3 shows that the anode 121 is electrically connected to the drain electrode 114 of the thin-film transistor 110, the anode 121 is electrically connected to the source electrode 113 of the thin-film transistor 110 depending on the type of the thin-film transistor 110.

The bank 140 is disposed on the anode 121 and the planarization layer 105. The bank 140 is an insulating layer for distinguishing adjacent sub-pixels SP one from another. The bank 140 may be disposed to open a part of the anode 121. The bank 140 may be formed of an organic insulating material disposed to cover the edge of the anode 121. The bank 140 includes a plurality of openings 143 and one or more holes 141. The bank 140 will be described in more detail later with reference to FIG. 3.

The emission layer 122 is disposed on the anode 121. The emission layer 122 may be formed of a single emission layer or a stack of multiple layers that emit light of different colors. The emission layer 122 may further include a hole injecting layer, a hole transporting layer, an electron transporting layer, and an electron injecting layer. Although FIG. 3 shows that the emission layer 122 disposed in each sub-pixel SP is separated from that disposed in another sub-pixel SP, all or some of the emission layers 122 may be formed as a single layer across the plurality of sub-pixels SP.

The cathode 123 is disposed on the emission layer 122. The cathode 123 is formed of a conductive material that can supply holes to the emission layer 122. For example, the cathode 123 may be formed of, but is not limited to, a transparent conductive oxide such as indium tin oxide (ITO), indium zinc oxide (IZO), indium tin zinc oxide (ITZO), zinc oxide (ZnO) and tin oxide (TO), or an ytterbium (Yb) alloy. Although FIG. 3 shows that the cathode 123 is disposed in a sub-pixel SP is connected to that disposed another sub-pixel SP, the cathode 123 may also be disposed separately in each of the sub-pixels SP, like the anode 121.

The electroluminescent element 120 may be defined as being disposed in each of a first emission area EA1, a second emission area EA2, and a third emission area EA3. Each of the first emission area EA1, the second emission area EA2 and the third emission area EA3 may emit light of a single color independently and may correspond to a sub-pixel SP. The first emission area EA1, the second emission area EA2 and the third emission area EA3 may emit light of different colors and each may be, but is not limited to, one of a red emission area, a green emission area and a blue emission area.

The encapsulation layer 130 is disposed on the electroluminescent element 120. The encapsulation layer 130 is a sealing member that protects the electroluminescent element 120 from external moisture, air, impact, and the like. The encapsulation layer 130 includes a first inorganic layer 131 formed of an inorganic material, an organic layer 132 disposed on the first inorganic layer 131 and formed of an organic material, and a second inorganic layer 133 covering the organic layer 132 and formed of an inorganic material.

The first inorganic layer 131 seals the active area A/A to protect the electroluminescent element 120 from oxygen and moisture permeating into the active area A/A. The first inorganic layer 131 is formed of an inorganic material and may be formed of, but is not limited to, an inorganic material such as silicon nitride (SiNx), silicon oxide (SiOx) and aluminum oxide (AlOx).

The organic layer 132 is to provide a flat surface over the first inorganic layer 131. When a crack occurs in the first inorganic layer 131, the crack may be filled with the organic layer 132. If a foreign matter is placed on the first inorganic layer 131, the organic layer 132 covers the foreign matter. The organic layer 132 may be formed of, but is not limited to, an epoxy-based or acrylic-based polymer.

The second inorganic layer 133 is disposed so as to cover the organic layer 132. The second inorganic layer 133 may come in contact with the first inorganic layer 131 at the edge portion of the electroluminescent display device 100 to seal the organic layer 132 together with the first inorganic layer 131. The second inorganic layer 133 may be formed of, but is not limited to, an inorganic material such as silicon nitride (SiNx), silicon oxide (SiOx) and aluminum oxide (AlOx), like the first inorganic layer 131.

Although FIG. 3 shows that the encapsulation layer 130 includes the first inorganic layer 131, the organic layer 132 and the second inorganic layer 133, the numbers of the inorganic layers and the organic layers included in the encapsulation layer 130 is not limited to those shown in FIG. 3.

The touch film 107 is disposed on the encapsulation layer 130. The touch film 107 is disposed at least in the active area A/A including the electroluminescent element 120 to sense a touch input. The touch film 107 may include, but is not limited to, a base member and touch electrodes disposed on the base member. The polarizing plate 108 is disposed on the touch film 107 to reduce reflection of external light incident on the electroluminescent display device 100. It is to be noted that the configuration of the electroluminescent display device 100 shown in FIG. 3 is merely illustrative. In some implementations, the touch film 107 and the polarizing plate 108 may be eliminated.

The cover glass 109 is disposed on the polarizing plate 108. The cover glass 109 can protect the electroluminescent display device 100 from external moisture, air, impact, and the like.

Although not shown in FIG. 3, an adhesive layer is disposed between the encapsulation layer 130 and the touch film 107, between the touch film 107 and the polarizing plate 108, and between the polarizing plate 108 and the cover glass 109.

Referring to FIGS. 2 and 3, the bank 140 includes a plurality of openings 143 and holes 141. Each of the openings 143 exposes a part of the respective anodes 121. The emission layer 122 is disposed on the part of each of the anodes 121 that is exposed by the respective openings 143. Therefore, the opening 143 of the bank 140 may define an emission area, and may define a sub-pixel SP.

Each of the holes 141 is disposed between the openings 143. Referring to FIG. 2, the banks 140 may be separated from one another by the holes 141 so that each of the banks is disposed in the respective sub-pixels SP. The holes 141 of the banks 140 may be connected to one another, so that each of the banks is disposed for the respective sub-pixels SP. As a result, the planarization layer 105 disposed under the banks 140 can be exposed via the holes 141 of the banks 140. As shown in FIG. 3, when the emission layer 122 is disposed in each of the sub-pixels SP, the cathode 123 of the electroluminescent element 120, which is formed along the shape of the bank 140, may come in contact with the planarization layer 105.

Incidentally, since the electroluminescent display device 100 is the top-emission electroluminescent display device 100, the light emitted from the emission layer 122 may travel toward the cover glass 109. Specifically, the light emitted from the emission layer 122 may pass through the encapsulation layer 130, the touch film 107, the polarizing plate 108 and the cover glass 109, to exit out of the electroluminescent display device 100. However, the encapsulation layer 130, the touch film 107, the polarizing plate 108 and the cover glass 109 are formed of different materials and have different refractive indices. Therefore, as different layers having different refractive indices, some of the light emitted from the emission layer 122 may be totally reflected, such that it may not exit out of the electroluminescent display device 100 and may be confined therein.

For convenience of illustration, FIG. 3 shows first light L1 and second light L2 which are emitted from the emission layer 122 of the second emission area EA2 and reflected back to the inside between the touch film 107 and the encapsulation layer 130.

Referring to FIG. 3, the first light L1 and the second light L2 emitted from the electroluminescent element 120 of the second emission area EA2 travel toward the cover glass 109. However, they may be reflected at the interface between the touch film 107 and the encapsulation layer 130 to travel toward the electroluminescent element 120 of each of the first emission area EA1 and the third emission area EA3. At this time, the first light L1 and the second light L2 may be incident into the holes 141 of the banks 140, respectively. The first light L1 and the second light L2 incident into the hole 141 may be reflected inside the holes 141 several times and the intensity of the lights may be reduced.

Specifically, as the first light L1 is reflected inside the hole 141 several times, it may transmit or may be absorbed by the first inorganic layer 131, the cathode 123, the bank 140 and the like, such that the light may diminish. As a result, the first light L1 traveling toward the first emission area EA1 other than the second emission area EA2 is reflected inside the hole 141 several times and diminishes, so that it is not mixed with the light emitted from the electroluminescent element 120 of the first emission area EA1.

In addition, as the second light L2 is reflected inside the hole 141 several times, it may transmit or may be absorbed by the first inorganic layer 131, the cathode 123, the bank 140 and the like. However, the light may not diminish. When the second light L2 exits the hole 141, it may exit at an angle greater than the incident angle. Therefore, even if the second light L2 does not completely diminish inside the hole 141, the second light L2 exits at the angle greater than the incident angle, such that it may travel toward the front rather than toward the third emission area EA3 on the side. In addition, even if the second light L2 exits from the hole 141 toward the third emission area EA3, the second light L2 has been reflected inside the hole 141 several times and thus its intensity has become weak. Accordingly, it may not substantially affect the third emission area EA3. As a result, it is possible to suppress the second light L2 exiting from the hole 141 from being mixed with the light emitted from the electroluminescent element 120 of the third emission area EA3.

The holes 141 of the bank 140 may reflect the light incident into the hole 141 several times to diminish it like in the case of the first light L1, or may reflect the light incident into the hole 141 several times so that light having a reduced intensity exits like in the case of the second light L2.

Incidentally, some of the light emitted from the electroluminescent element 120 may not travel toward the outside of the electroluminescent display device 100 but may be totally reflected back to the inside of the electroluminescent display device 100 since different elements of the electroluminescent display device 100 have different refractive indices. Accordingly, when light emitted from an emission area is totally reflected to travel toward an adjacent emission area emitting light of a different color, color mixing may occur between the emission areas.

In view of the above, the banks 140 of the electroluminescent display device 100 according to an exemplary aspect of the present disclosure include the holes 141. Specifically, each of the holes 141 may be formed between the openings 143 of the banks 140. Some of the light emitted from the electroluminescent element 120 may not travel toward the outside of the electroluminescent display device 100 but may be totally reflected back to the inside of the electroluminescent display device 100 since different elements of the electroluminescent display device 100 have different refractive indices. Some of the light that has been emitted from an emission area and totally reflected may travel to another emission area where light of a different color is emitted. At this time, a part of the light emitted from an emission area to travel to another emission area may be reflected inside the hole 141 of the bank 140 several times, such that the intensity of the part of the light may be reduced, and ultimately, it may diminish. A part of the light incident into the hole 141 of the bank 140 is reflected inside the hole 141 of the bank 140 several times so that the intensity of the light is reduced, but it may not diminish and may be reflected out of the hole 141. However, even if the light is reflected to the outside of the hole 141, the light is emitted at an angle greater than the incident angle, so that the light can be reflected as close to the front as possible. Even if the light incident into the hole 141 is reflected out of the hole 141 toward another emission area, the intensity of the light became weak as it had been reflected inside the hole 141 several times, so that color mixing can be suppressed. Therefore, in the electroluminescent display device 100 according to an exemplary aspect of the present disclosure, the holes 141 are formed in the banks 140 disposed between the electroluminescent elements 120, so that the light traveling toward another emission area can diminish or become weak, and the angle of the light traveling toward another emission area can be changed as close to the front as possible to suppress color mixing of the light.

Hereinafter, the effects achieved by the bank 140 of the electroluminescent display device 100 according to an exemplary aspect of the present disclosure will be described in more detail with reference to FIG. 4.

Figure 4:
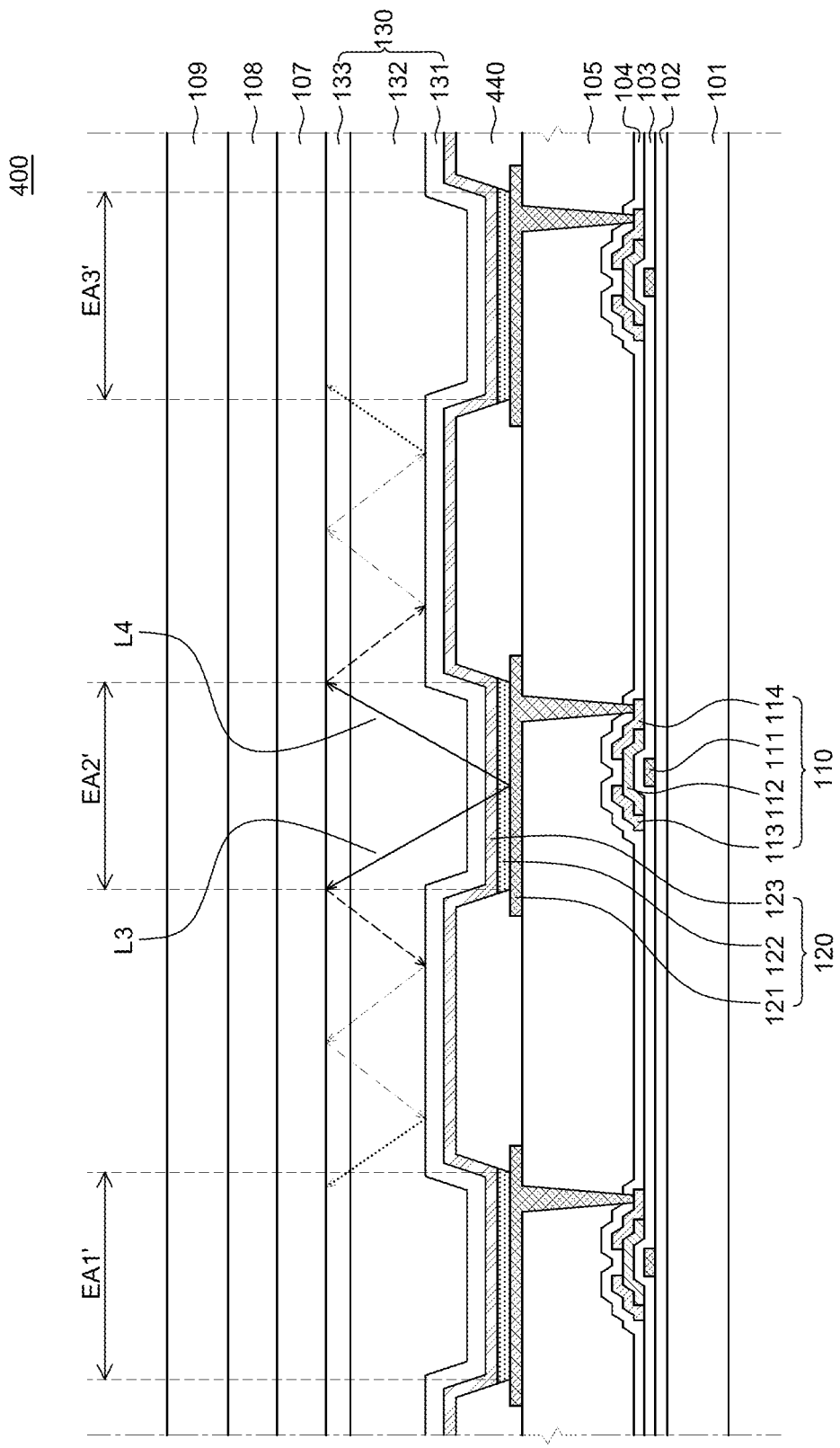
FIG. 4 is a cross-sectional view of an electroluminescent display device according to Comparative Example.

FIG. 4 is a cross-sectional view of an electroluminescent display device according to Comparative Example. The electroluminescent display device 400 according to Comparative Example shown in FIG. 4 is substantially identical to the electroluminescent display device 100 according to the exemplary aspect of the present disclosure except that the former does not include holes in the banks 440; and, therefore, the redundant description will be omitted.

Referring to FIG. 4, a bank 440 of the electroluminescent display device 400 according to Comparative Example includes no hole, such that it has a flat surface except openings via each of which an emission layer 122 is exposed. Accordingly, a cathode 123 disposed on the bank 440 may not be in contact with a planarization layer 105.

For convenience of illustration, FIG. 4 shows third light L3 and fourth light L4 which are emitted from an emission layer 122 of a second emission area EA2' and reflected back to the inside at the interface between a touch film 107 and an encapsulation layer 130.

The third light L3 and the fourth light L4 emitted from the second emission area EA' are reflected back to the inside between the touch film 107 and the encapsulation layer 130. Specifically, the third light L3 may be totally reflected inside the electroluminescent display device 400 to travel toward a first emission area EA1'. Likewise, the fourth light L4 may be totally reflected inside the electroluminescent display device 400 to travel toward a third emission area EA3'.

As mentioned earlier, the first emission area EA1', the second emission area EA2', and the third emission area EA3' may emit light of different colors. Also in the electroluminescent display device 400 according to Comparative Example shown in FIG. 4, a part of the light diminishes by total reflection inside the electroluminescent display device 400. However, the light L3 and the light L4 emitted from the second emission area EA2' may travel toward the first emission area EA1' and the third emission area EA3', respectively. When this happens, the light L3 and the light L4 emitted from the second emission area EA2' may travel toward the first emission area EA1' or the third emission area EA3', such that color mixing may occur. As a result, the reliability of the electroluminescent display device 400 may be lowered.

To overcome such problems, the electroluminescent display device 100 according to an exemplary aspect of the present disclosure includes the plurality of holes 141 formed in the banks 140 to suppress color mixing of lights. Specifically, the banks 140 and the holes 141 are disposed between the electroluminescent elements 120 that emit light of different colors. The majority of the light emitted from each of the electroluminescent elements 120 exits within the respective emission areas. In the electroluminescent display device 400 according to Comparative Example, a part of the light emitted from the electroluminescent element 120 may be totally reflected and may travel toward an emission area that emits light of a different color, resulting in color mixing. In this regard, in the electroluminescent display device 100 according to an exemplary aspect of the present disclosure, the holes 141 are formed in the banks 140 disposed between the electroluminescent elements 120 to diminish the light traveling toward another emission area. In addition, the intensity of light traveling to another emission area can be weakened, or the angle at which the light traveling to another emission area can be changed as close to the front as possible, thereby suppressing the color mixing of lights.

Figure 5A:
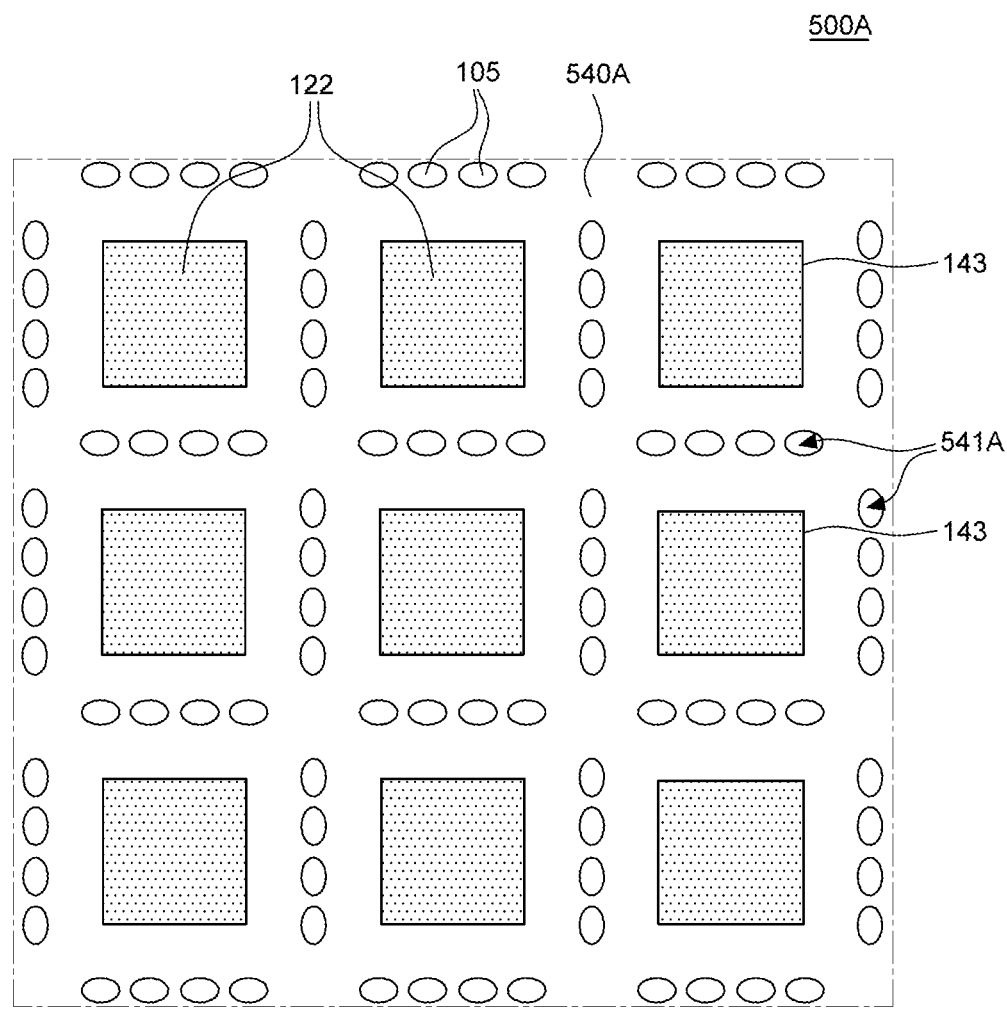
FIG. 5A is an enlarged plan view of an electroluminescent display device according to another exemplary aspect of the present disclosure.

FIG. 5A is an enlarged plan view of an electroluminescent display device according to another exemplary aspect of the present disclosure. An electroluminescent display device 500A shown in FIG. 5A is substantially identical to the electroluminescent display device 100 of FIGS. 1 to 3 except that the shape of holes 541A disposed in a bank 540A is different; and, therefore, the redundant description will be omitted. For convenience of illustration, FIG. 5 shows only emission layers 122 of electroluminescent elements 120 and a bank 540A disposed in the sub-pixels SP.

Referring to FIG. 5A, a bank 540A includes a plurality of holes 541A disposed between a plurality of openings 143. The plurality of holes 541A is disposed along the boundary between the plurality of openings 143 to expose the planarization layer 105. In addition, even though the plurality of holes 541A is formed in the bank 540A, the bank 540A may be formed as a single piece.

Although FIG. 5A shows four elliptical holes 541A arranged between the openings 143, the shape and the number of the holes 541A arranged between the openings 143 are not limited thereto.

The electroluminescent display device 500A according to another exemplary aspect of the present disclosure includes a bank 540A in which a plurality of holes 541A is disposed. Specifically, the holes 541A are disposed between the openings 143 where the emission layers 122 are disposed, and expose the planarization layer 105 under the bank 540A. The light emitted from the electroluminescent element 120 may exit out of the electroluminescent display device 500A. However, as different elements disposed on the electroluminescent element 120 such as the encapsulation layer 130 and the polarizing plate 108 have different refractive indices, the totally-reflected light may be confined inside the electroluminescent display device 500A. When this happens, some of the light reflected back to the inside may diminish in the holes 541A of the bank 540A or may be reflected back to the outside of the electroluminescent display device 500A before being reflected to an emission area that emits light of a different color to result in color mixing. Accordingly, in the electroluminescent display device 500A according to this exemplary aspect of the present disclosure, the holes 541A are formed in the bank 540A, so that the light traveling toward another emission area may be reflected several times to diminish or become weak, to suppress the color mixing of the light. In addition, the angle of the light traveling toward another emission area can be changed as close to the front as possible to suppress color mixing of the light.

Figure 5B:
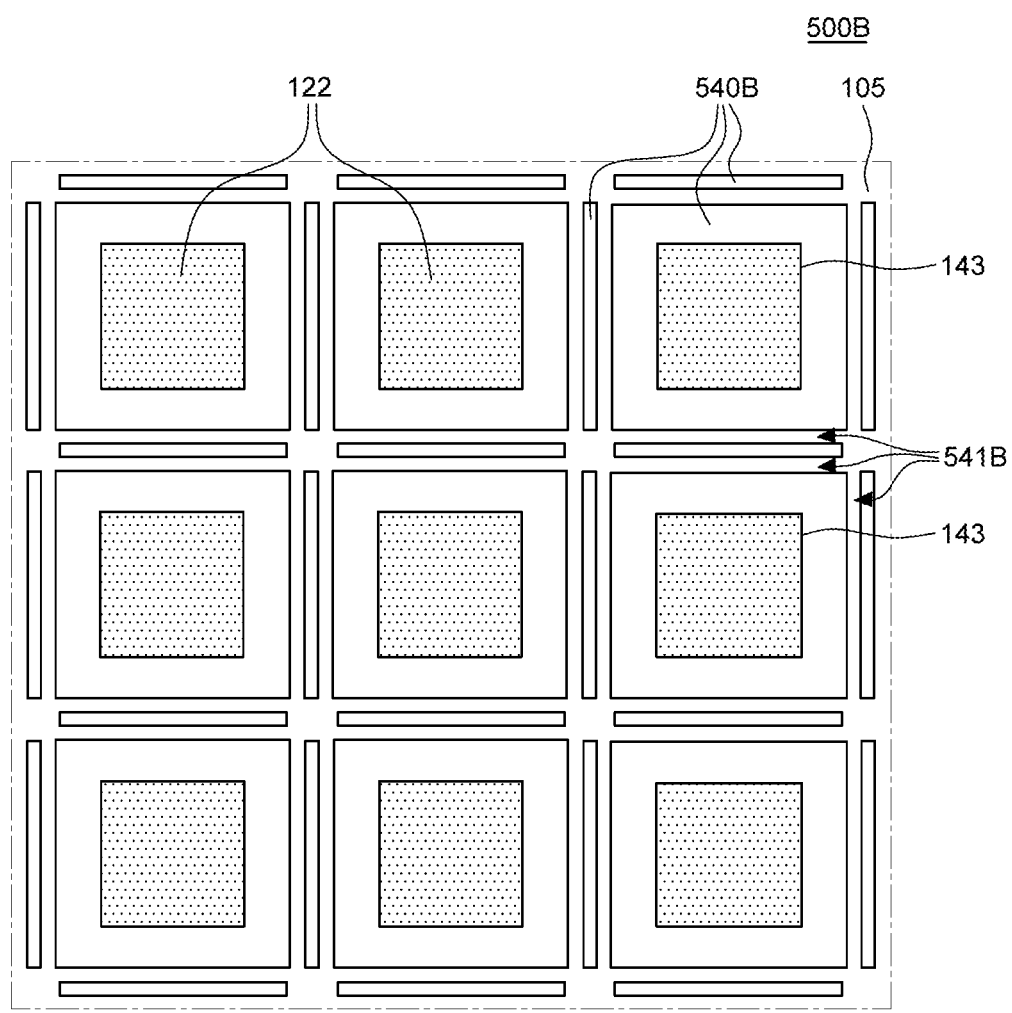
FIG. 5B is an enlarged plan view of an electroluminescent display device according to yet another exemplary aspect of the present disclosure.

FIG. 5B is an enlarged plan view of an electroluminescent display device according to yet another exemplary aspect of the present disclosure. An electroluminescent display device 500B shown in FIG. 5B is substantially identical to the electroluminescent display device 100 of FIGS. 1 to 3 except for the shape of holes 541B formed in banks 540B; and, therefore, the redundant description will be omitted. For convenience of illustration, FIG. 5B shows only emission layers 122 of electroluminescent elements 120 and banks 540B disposed in the sub-pixels SP.

Referring to FIG. 5B, the banks 540B are disposed between a plurality of openings 143 and include a plurality of holes 541B spaced apart from one another. In the electroluminescent display device 100 shown in FIGS. 2 and 3, one hole 141 is disposed between the openings 143. In contrast, in the electroluminescent display device 500B according to this exemplary aspect shown in FIG. 5B, two holes 541B may be disposed between the openings 143.

Although FIG. 5B shows that two holes 541B are disposed between the openings 143, the present disclosure is not limited thereto. More than two holes may be disposed between the openings 143 or the holes 541B may have different arrangements.

The electroluminescent display device 500B according to yet another exemplary aspect of the present disclosure includes the banks 540B in which the holes 541B are formed. Specifically, two holes 541B are disposed between the openings 143 of the banks 540B, such that the holes 541B expose a planarization layer 105 under the banks 540B. Therefore, a bank 540B may be separated from another bank 540B by the two holes 541B. The light emitted from the electroluminescent element 120 may be totally reflected while traveling toward the outside of the electroluminescent display device 500B and may travel toward the inside of the electroluminescent display device 500B. In doing so, some of the light reflected back to the inside may travel toward the holes 541B of the banks 540B before being reflected to an emission area that emits light of a different color to result in color mixing. Even if some of the light reflected to another emission area may pass by one hole 541B of the two holes 541B disposed in the banks 540B, it may travel toward the other hole 541B. That is to say, the probability that the light directed to an emission area that emits light of a different color is incident into the holes 541B increases. The light reflected into each of the two holes 541B may be reflected inside the holes 541B several times so that the intensity becomes weak or may be reflected back to the outside of the electroluminescent display device 500B. Accordingly, in the electroluminescent display device 500B according to this exemplary aspect of the present disclosure, as the two holes 541B are formed between the openings 143 of the banks 540B, there are more chances to suppress the light traveling toward another emission area and thus it is possible to further suppress color mixing of lights.

Figure 6:
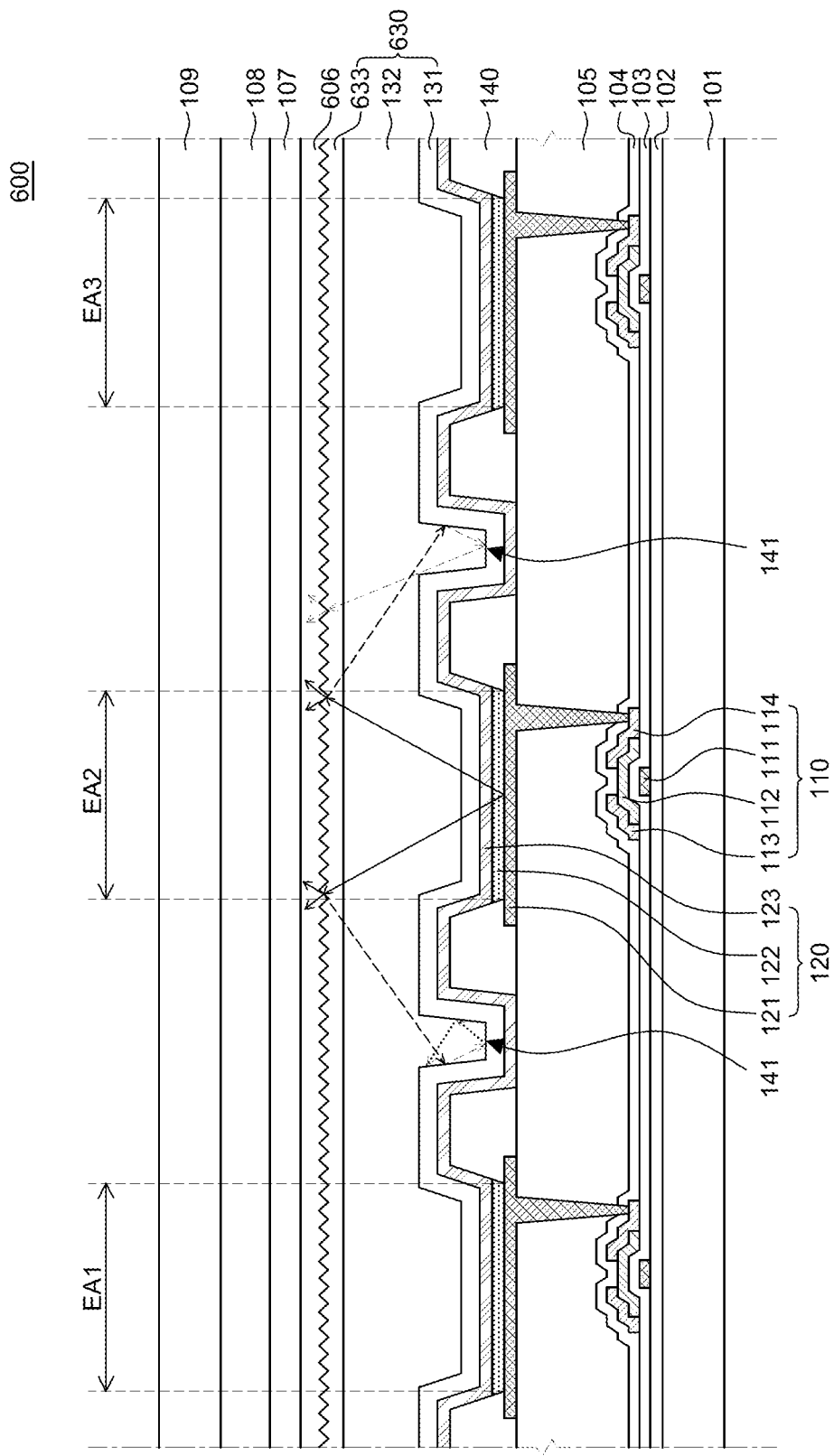
FIG. 6 is a cross-sectional view of an electroluminescent display device according to still another exemplary aspect of the present disclosure.

FIG. 6 is a cross-sectional view of an electroluminescent display device according to still another exemplary aspect of the present disclosure. An electroluminescent display device 600 shown in FIG. 6 is substantially identical to the electroluminescent display device of FIGS. 1 to 3 except for the shape of an encapsulation layer 630; and, therefore, the redundant description will be omitted.

Referring to FIG. 6, the encapsulation layer 630 includes a first inorganic layer 131 on an electroluminescent element 120, an organic layer 132 on the first inorganic layer 131, and a second inorganic layer 633 on the organic layer 132. The second inorganic layer 633 includes grooves formed in its upper surface.

Referring to FIG. 6, an adhesive layer 606 is disposed between the encapsulation layer 630 and a touch film 107. The adhesive layer 606 may provide a flat surface over the second inorganic layer 633 and attach the second inorganic layer 633 to the touch film 107. Although FIG. 6 shows only the adhesive layer 606 disposed between the encapsulation layer 630 and the touch film 107 for convenience of illustration, this is merely illustrative. The adhesive layer 606 may be further disposed between the touch film 107 and the polarizing plate 108 and between the polarizing plate 108 and the cover glass 109.

Although FIG. 6 shows the grooves formed in the upper surface of the second inorganic layer 633 in a saw-tooth shape, this is merely illustrative. The shape of the grooves may include, but is not limited to, a lens shape, a concave-convex shape, a sine wave shape, or the like.

The light emitted from the electroluminescent element 120 may transmit the encapsulation layer 630 to travel to the outside of the electroluminescent display device 600. Some of the light traveling toward the upper surface of the second inorganic layer 633 may be incident at an angle greater than a threshold angle to be totally reflected. If the upper surface of the second inorganic layer 633 is flat, the light incident at the angle greater than the threshold angle may be totally reflected back to the inside of the electroluminescent display device 600.

In the electroluminescent display device 600 according to still another exemplary aspect of the present disclosure, the encapsulation layer 630 includes a plurality of grooves and a plurality of grooves is formed in the upper surface of the second inorganic layer 633. The upper surface of the second inorganic layer 633 in which the plurality of grooves is formed may not be flat but may have a concave-convex structure. Accordingly, in the electroluminescent display device 600 according to this exemplary aspect of the present disclosure, the plurality of grooves is formed in the upper surface of the second inorganic layer 633, so that the light incident on the touch film 107 at an angle greater than a threshold angle is scattered by the grooves, to reduce the total reflection between the encapsulation layer 630 and the touch film 107. Accordingly, the out-coupling efficiency of the electroluminescent display device 600 can be improved, the lifetime of the electroluminescent display device 600 can be increased, and the power consumption can be reduced.

Figure 7A:
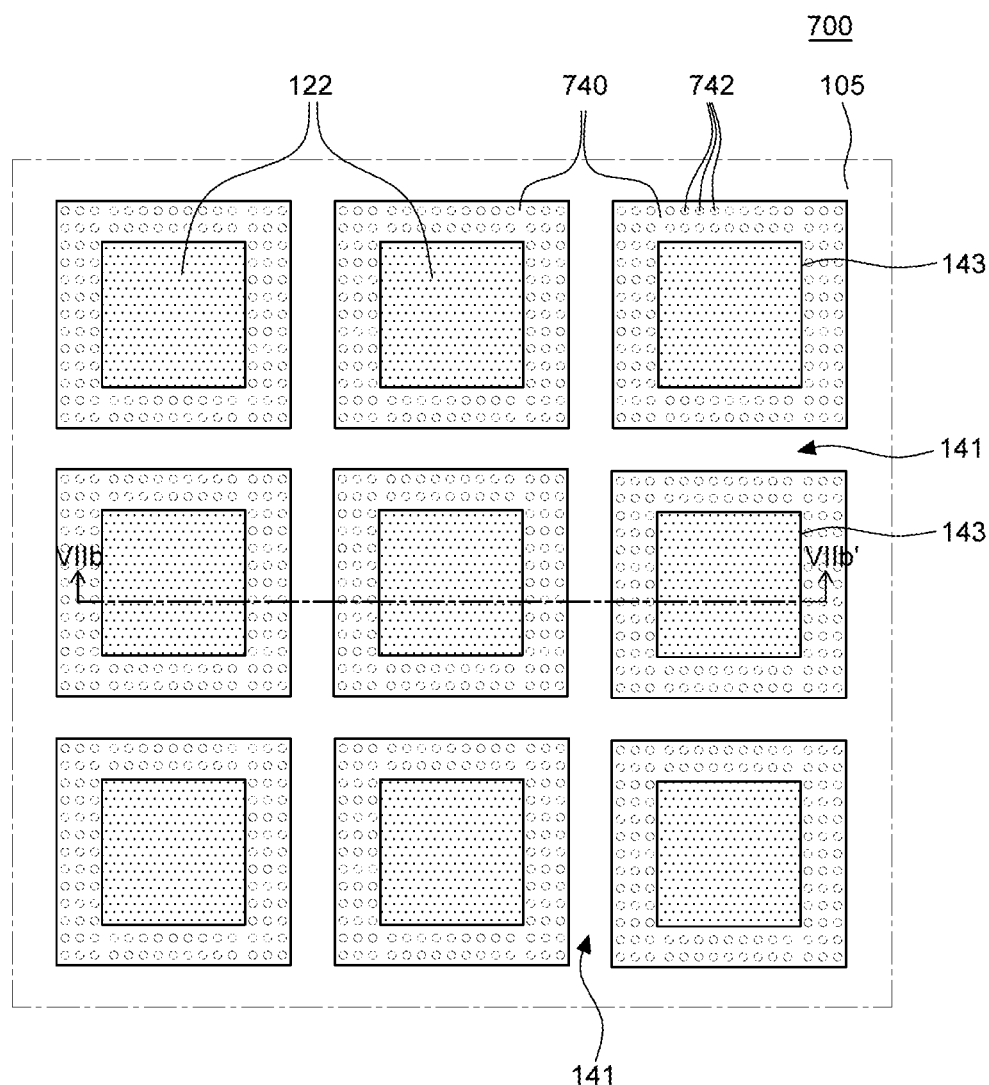
FIG. 7A is an enlarged plan view of an electroluminescent display device according to yet another exemplary aspect of the present disclosure.
Figure 7B:
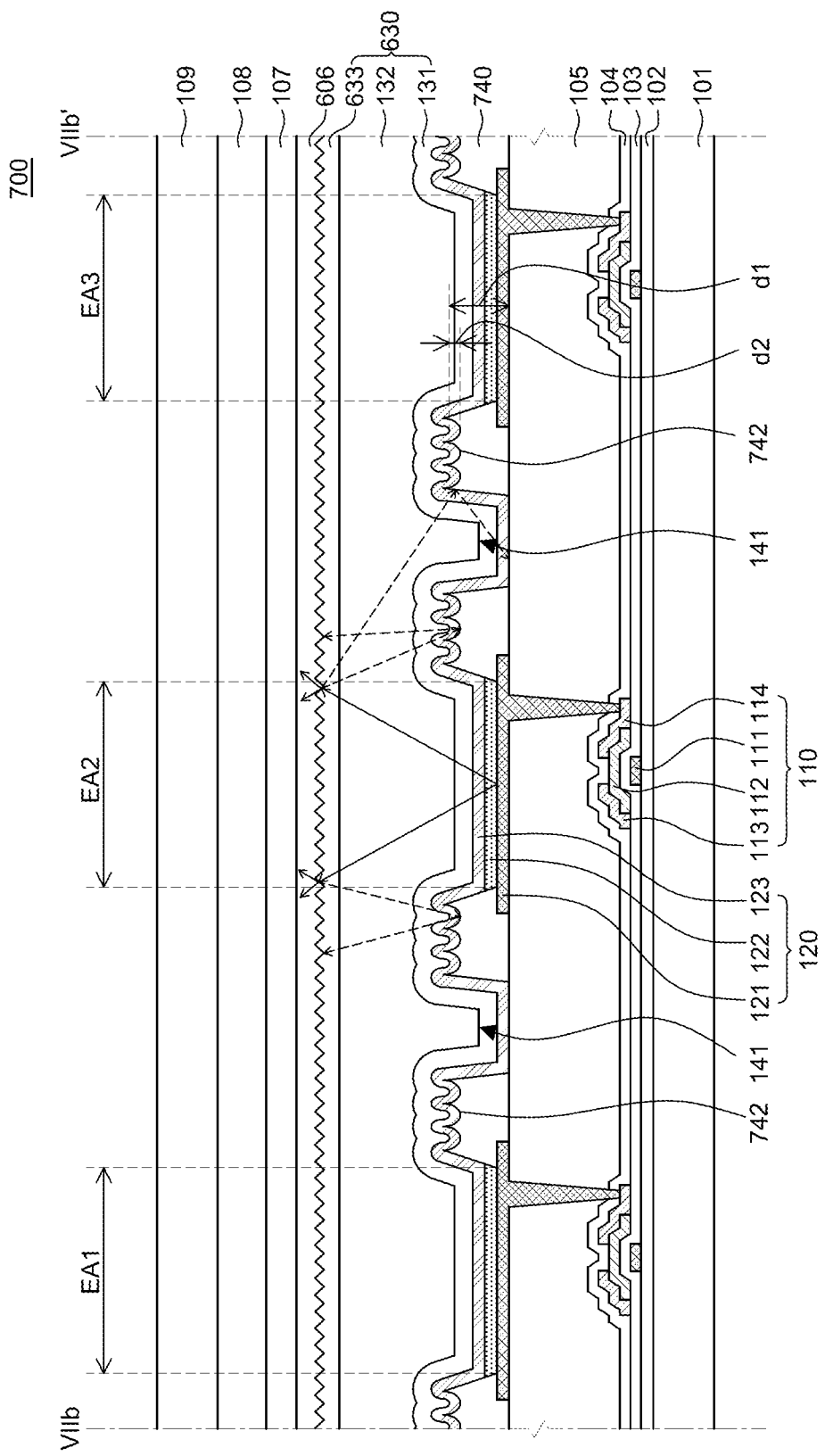
FIG. 7B is a cross-sectional view taken along line VIIb-VII'b of FIG. 7A.

FIG. 7A is an enlarged plan view of an electroluminescent display device according to yet another exemplary aspect of the present disclosure. FIG. 7B is a cross-sectional view taken along line VIIIb-VIII'b of FIG. 7A. An electroluminescent display device 700 shown in FIGS. 7A and 7B is substantially identical to the electroluminescent display device 600 of FIG. 6 except for the shape of banks 740; and, therefore, the redundant description will be omitted.

Referring to FIGS. 7A and 7B, the banks 740 further include a plurality of grooves 742 formed in the upper surfaces of the banks 740. The depth d2 of the grooves 742 is different from the depth d1 of the holes 141. Specifically, the holes 141 penetrate through the banks 740 and extend from the upper surface to the lower surface of the banks 740, exposing the planarization layer 105 under the banks 740. In other words, the depth d1 of the holes 141 may be equal to the overall height of the banks 740. On the other hand, the grooves 742 do not penetrate the banks 740 but are formed near the upper surface of the banks 740, not exposing the planarization layer 105 under the banks 740. Accordingly, the depth d2 of the grooves 742 of the banks 740 is smaller than the depth d1 of the holes 141, and accordingly different effects are achieved by the holes 141 and the grooves 742 as they have different the depths d1 and d2. Such effects will be described in more detail with reference to FIG. 7B.

Referring to FIG. 7B, the light emitted from the electroluminescent element 120 travels toward the outside of the electroluminescent display device 700. However, as different elements on the electroluminescent element 120 have different refractive indices, a part of the light is totally reflected back to the electroluminescent element 120. A part of the light traveling toward the electroluminescent element 120 is directed to the grooves 742 of the banks 740 and the holes 141 of the bank 740. The path of the light traveling toward the grooves 742 of the banks 740 may be changed at the grooves 742 toward the outside of the electroluminescent display device 700. On the other hand, as described above with reference to FIGS. 1 to 3, the path of the light traveling toward the holes 141 of the banks 740 may be changed toward the outside of the electroluminescent display device 700. However, the light may not exit from and diminish inside the holes 141 since the depth d1 of the holes 141 is greater than the depth d2 of the grooves 742.

Although FIG. 7B shows that the grooves 742 formed in the bank 740 have a lens shape, this is merely illustrative. The shape of the grooves 742 may include, but is not limited to, a saw-tooth shape, a concave-convex shape, a sine wave shape, or the like.

The bank 740 of the electroluminescent display device 700 according to yet another exemplary aspect of the present disclosure includes a plurality of grooves 742. The light emitted from the electroluminescent element 120 may be totally reflected as it travels toward the outside of the electroluminescent display device 700 and then may travel toward the electroluminescent element 120 again. At this time, some of the light may be incident into the grooves 742 of the banks 740. The incident light is reflected at the grooves 742 of the banks 740, and the path may be changed so that the light may be directed to the outside of the electroluminescent display device 700 again. Therefore, in the electroluminescent display device 700 according to this exemplary aspect of the present disclosure, the light that is totally reflected and confined in the inside may be reflected again at the grooves 742 of the banks 740, so that the light travels to the outside of the electroluminescent display device 700. As a result, the out-coupling efficiency can be increased. In addition, as the out-coupling efficiency is increased, the lifetime of the electroluminescent display device 700 can be improved, and the power consumption can be reduced as well.

Figure 8:
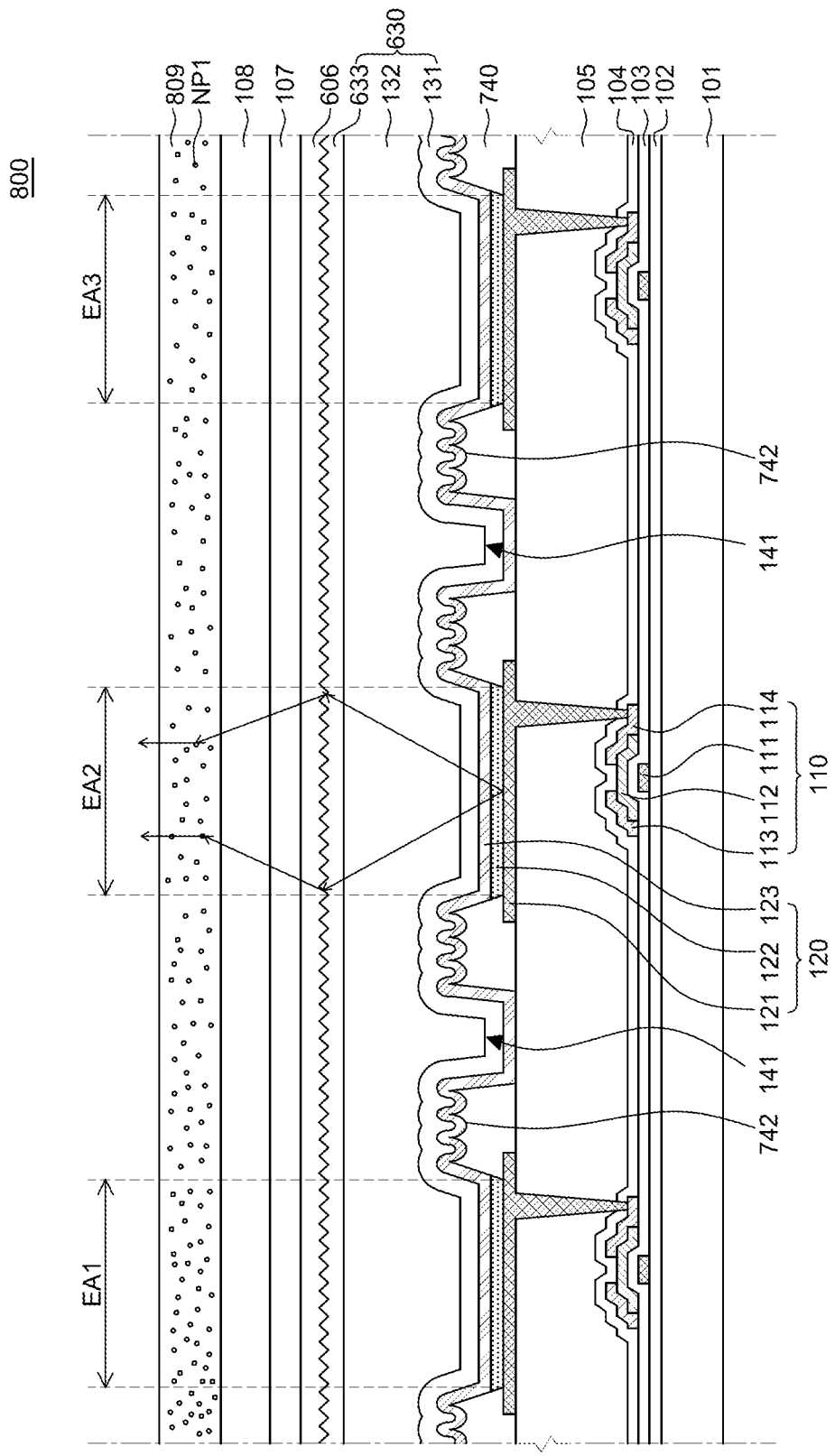
FIG. 8 is a cross-sectional view of an electroluminescent display device according to still another exemplary aspect of the present disclosure.

FIG. 8 is a cross-sectional view of an electroluminescent display device according to still another exemplary aspect of the present disclosure. An electroluminescent display device 800 shown in FIG. 8 is substantially identical to the electroluminescent display device 700 of FIG. 7B except for a cover glass 809; and, therefore, the redundant description will not be made.

Referring to FIG. 8, the cover glass 809 contains first light-scattering particles NP1. The first light-scattering particles NP1 scatter light incident on the cover glass 809. The light-scattering particles may be, but is not limited to, titanium oxide (TiO2) nanoparticles or zirconium oxide (ZrO2) nanoparticles.

The light incident on the cover glass 809 from the electroluminescent element 120 is scattered by the first light-scattering particles NP1. The scattered light may travel in various directions and is more likely to travel to the outside of the cover glass 809, i.e., the outside of the electroluminescent display device 800.

The cover glass 809 of the electroluminescent display device 800 according to yet another exemplary aspect of the present disclosure contains the first light-scattering particles NP1. The light incident on the cover glass 809 may be scattered by the first light-scattering particles NP1. The scattered light may travel in various directions, and accordingly it is more likely to travel to the outside of the cover glass 809. Therefore, the amount of the light traveling to the outside of the cover glass 809 increases, such that the out-coupling efficiency of the electroluminescent display device 800 can be improved, the lifetime of the electroluminescent display device 800 can be increased, and the power consumption can be reduced.

Figure 9:
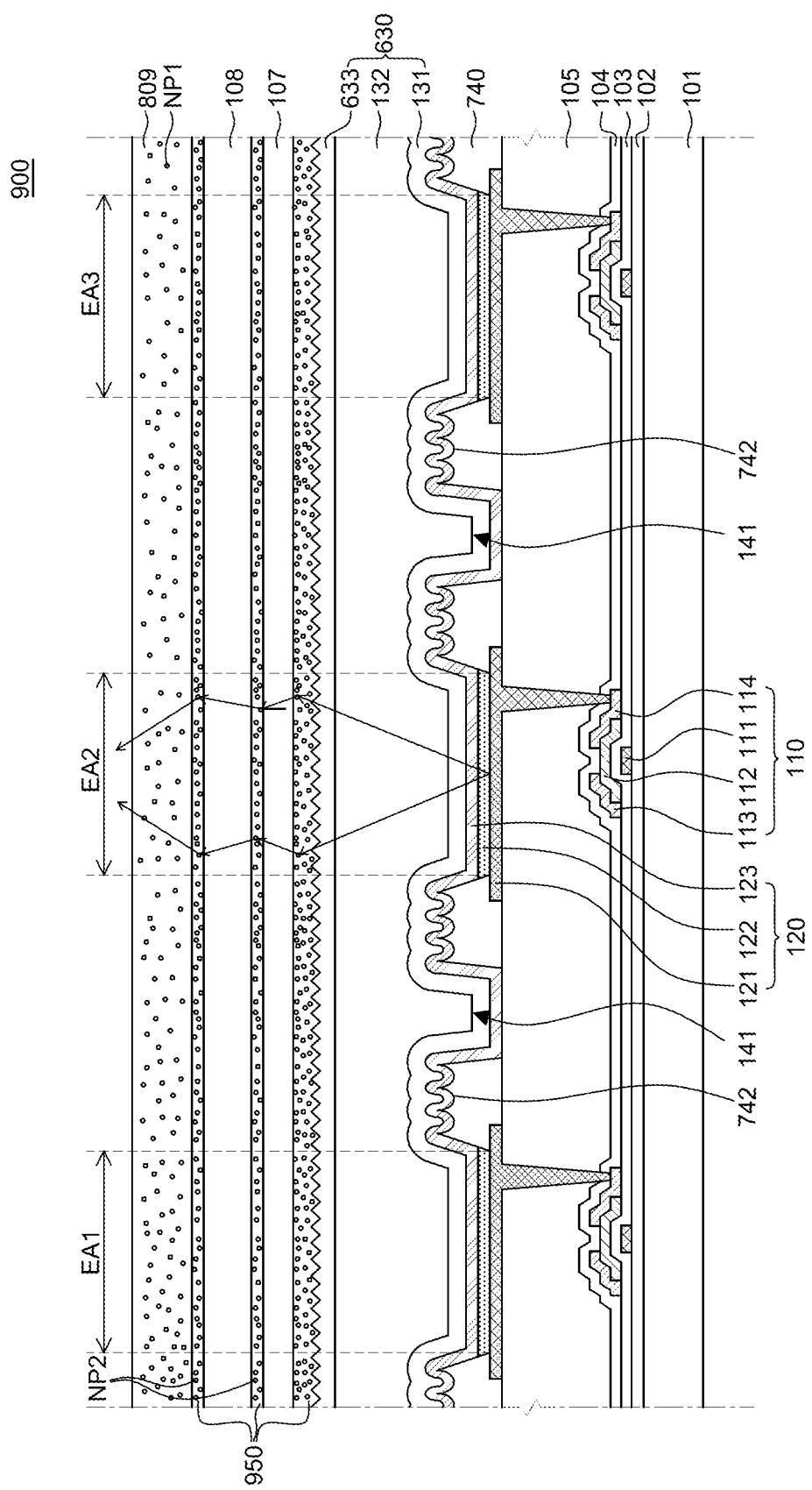
FIG. 9 is a cross-sectional view of an electroluminescent display device according to yet another exemplary aspect of the present disclosure.

FIG. 9 is a cross-sectional view of an electroluminescent display device according to yet another exemplary aspect of the present disclosure. An electroluminescent display device 900 shown in FIG. 9 is substantially identical to the electroluminescent display device 800 of FIG. 8 except for adhesive layers 950; and, therefore, the redundant description will not be made.

Referring to FIG. 9, the adhesive layer 950 of the electroluminescent display device 900 according to yet another exemplary aspect of the present disclosure contains second light-scattering particles NP2. Specifically, an encapsulation layer 630, a touch film 107, a polarizing plate 108 and a cover glass 809 are disposed on an electroluminescent element 120, and each of the adhesive layers 950 containing the second light-scattering particles NP2 is disposed between every two of the above-described elements. Accordingly, the adhesive layers 950 containing the second light-scattering particles NP2 may work as light-scattering layers.

For example, the adhesive layer 950 can be disposed between the encapsulation layer 630 and the touch film 107, between the touch film 107 and the polarizing plate 108, and between the polarizing plate 108 and the cover glass 809, and the second light-scattering particles NP2 may be further disposed on each adhesive layer 950. On the other hand, although the second light-scattering particles NP2 are shown as being dispersed in all of the plurality of adhesive layers 950, they may be dispersed only in some of the adhesive layers 950, for example.

In the electroluminescent display device 900 according to this exemplary aspect of the present disclosure, the plurality of adhesive layers 950 is disposed, each of which may contain the second light-scattering particles NP2. The light emitted from the electroluminescent element 120 may travel toward the outside of the electroluminescent display device 900 and may be scattered by the second light-scattering particles NP2 of the adhesive layers 950. The scattered light may travel in various directions, and accordingly the light is more likely to travel to the outside of the electroluminescent display device 900. Accordingly, in the electroluminescent display device 900 according to this exemplary aspect of the present disclosure, the second light-scattering particles NP2 are dispersed in the adhesive layers 950, such that the out-coupling efficiency of the electroluminescent display device 900 can be improved. In addition, as the out-coupling efficiency is increased, the lifetime of the electroluminescent display device 900 can be increased, and the power consumption can be reduced as well.

The exemplary aspects of the present disclosure can also be described as follows:

According to an aspect of the present disclosure, an electroluminescent display device includes: a substrate; a plurality of anodes disposed on the substrate; a bank disposed over the substrate and the plurality of anodes, the bank comprising a plurality of openings each exposing a part of the respective anodes, and one or more holes formed between the openings; a plurality of emission layers on each of the anodes; and a plurality of cathodes on each of the emission layer.

The holes may be connected to one another.

Each of the holes may include a plurality of holes.

The bank may further include a plurality of grooves formed in an upper surface of the bank.

The depth of the plurality of grooves may be smaller than the depth of the holes.

The electroluminescent display device may further include: an encapsulation layer disposed on the cathode and comprising a first inorganic layer, an organic layer on the first inorganic layer, and a second inorganic layer on the organic layer. The second inorganic layer may include a plurality of grooves formed in an upper surface thereof.

The electroluminescent display device may further include: a touch film on the encapsulation layer; a polarizing plate on the touch film; and a cover glass on the polarizing plate. The cover glass may contain a plurality of first light-scattering particles.

The electroluminescent display device may further include: an adhesive layer disposed at least one of: between the encapsulation layer and the touch film; between the touch film and the polarizing plate; and between the polarizing plate and the cover glass. The adhesive layer may contain a plurality of second light-scattering particles.

According to another aspect of the present disclosure, an electroluminescent display device includes: a substrate having a plurality of emission areas; a plurality of electroluminescent elements each disposed on the substrate in the respective emission areas, each of the electroluminescent elements comprising an anode, an emission layer on the anode, and a cathode on the emission layer; a bank disposed to cover a part of the anode to define each of the emission areas and comprising a plurality of first patterns; an encapsulation layer covering the electroluminescent elements and comprising an inorganic layer and an organic layer stacked on one another, the encapsulation layer comprising a plurality of second patterns in an upper surface thereof; and a cover glass disposed on the encapsulation layer, wherein the plurality of first patterns comprises one or more holes to suppress color mixing between the emission areas.

The plurality of first patterns may have such a shape that light incident on the plurality of first patterns exits at an angle greater than an incidence angle.

The plurality of first patterns may have such a shape that an intensity of exiting light is smaller than an intensity of incident light.

The cover glass may contain a plurality of light-scattering particles for out-coupling with respect to light emitted from the emission layer.

The electroluminescent display device may further include: at least one more light-scattering layer disposed between the cover glass and the encapsulation layer and containing a plurality of light-scattering particles for out-coupling with respect to the light emitted from the emission layer.

The light-scattering layer may further include an adhesive material.

Thus far, exemplary aspects of the present disclosure have been described in detail with reference to the accompanying drawings. However, the present disclosure is not limited to the exemplary aspects, and modifications and variations can be made thereto without departing from the technical idea of the present disclosure. Accordingly, the exemplary aspects described herein are merely illustrative and are not intended to limit the scope of the present disclosure. The technical idea of the present disclosure is not limited by the exemplary aspects. Therefore, it should be understood that the above-described aspects are not limiting but illustrative in all aspects. The scope of protection sought by the present disclosure is defined by the appended claims and all equivalents thereof are construed to be within the true scope of the present disclosure.

What is claimed is:

1. An electroluminescent display device comprising:
    a substrate;
    a planarization layer disposed on the substrate;
    a plurality of anodes disposed on the planarization layer;
    a bank disposed over the planarization layer and the plurality of anodes, wherein the bank has a plurality of openings each exposing a part of each anode, and one or more holes formed between the plurality of openings and exposing a part of the planarization layer;

an emission layer on each of the plurality of anodes; and a cathode disposed on the emission layer and the bank, wherein the cathode, which is disposed along the shape of the one or more holes and the bank, come in contact with the part of the planarization layer in the one or more holes.

2. The electroluminescent display device of claim 1, wherein the one or more holes are connected to one another.

3. The electroluminescent display device of claim 1, wherein each of the one or more holes comprises a plurality of holes.

4. The electroluminescent display device of claim 1, wherein the bank further comprises a plurality of grooves formed in an upper surface of the bank.

5. The electroluminescent display device of claim 4, wherein the plurality of grooves has a depth smaller than a depth of the one or more holes.

6. The electroluminescent display device of claim 1, further comprising:

an encapsulation layer disposed on the cathode and including a first inorganic layer, an organic layer on the first inorganic layer, and a second inorganic layer on the organic layer, wherein the second inorganic layer has a plurality of grooves formed in an upper surface thereof.

7. The electroluminescent display device of claim 6, further comprising:

a touch film on the encapsulation layer;

a polarizing plate on the touch film; and a cover glass on the polarizing plate, wherein the cover glass contains a plurality of first light-scattering particles.

8. The electroluminescent display device of claim 7, further comprising:

an adhesive layer disposed at least one of: between the encapsulation layer and the touch film; between the touch film and the polarizing plate; and between the polarizing plate and the cover glass, wherein the adhesive layer contains a plurality of second light-scattering particles.

9. An electroluminescent display device comprising:

a plurality of emission areas defined over a substrate;

a planarization layer disposed on the substrate;

a plurality of electroluminescent elements each disposed on the planarization layer corresponding to each of the plurality of emission areas, each of the electroluminescent elements including an anode, an emission layer on the anode, and a cathode on the emission layer;

a bank disposed to cover the planarization layer and a part of the anode, defining the plurality of emission areas and having a plurality of first patterns;

an encapsulation layer covering the plurality of electroluminescent elements and including an inorganic layer and an organic layer alternatively stacked, the encapsulation layer having a plurality of second patterns on an upper surface thereof; and a cover glass disposed on the encapsulation layer, wherein the plurality of first patterns has one or more holes to suppress color mixing between the plurality of emission areas and exposing a part of the planarization layer, and wherein the cathode, which is disposed along the shape of the plurality of first patterns and the bank, come in contact with the part of the planarization layer in the one or more holes.

10. The electroluminescent display device of claim 9, wherein the plurality of first patterns has such a shape that light incident on the plurality of first patterns exits at an angle greater than an incidence angle.

11. The electroluminescent display device of claim 9, wherein the plurality of first patterns has such a shape that an intensity of exiting light is smaller than an intensity of incident light.

12. The electroluminescent display device of claim 9, wherein the cover glass contains a plurality of light-scattering particles increasing an out-coupling efficiency of the light emitted from the emission layer.

13. The electroluminescent display device of claim 12, further comprising:

one or more light-scattering layers disposed between the cover glass and the encapsulation layer and containing a plurality of light-scattering particles increasing an out-coupling efficiency of the light emitted from the emission layer.

14. The electroluminescent display device of claim 13, wherein the one or more light-scattering layers further comprises an adhesive material.

15. An electroluminescent display device, comprising:

a plurality of emission areas defined on a substrate and each emitting single color light;

a planarization layer disclosed on the substrate;

an electroluminescent element corresponding to each of the plurality of emission areas;

a color mixing inhibiting trench surrounding the electroluminescent element preventing the emitted single color light from being mixed with other single color light emitted from adjacent emission areas; and a total reflection prevention layer disposed over the color mixing inhibiting trench and exposing a part of the planarization layer, wherein the total reflection prevention layer making light incident on the total reflection prevention layer exit at an angle greater than an incidence angle, wherein the electroluminescent element has a cathode disposed on the color mixing inhibiting trench, wherein the cathode is disposed along the shape of the color mixing inhibiting trench, wherein the electroluminescent element and the color mixing inhibiting trench are disposed on the planarization layer, and wherein the cathode come in contact with the part of the planarization layer in the total reflection prevention layer.

16. The electroluminescent display device of claim 15, wherein the total reflection prevention layer has such a shape that an intensity of exiting light is smaller than an intensity of incident light.

17. The electroluminescent display device of claim 15, further comprising a cover glass over the total reflection prevention layer and containing a plurality of light-scattering particles increasing an out-coupling efficiency of the light emitted from the emission areas.

18. The electroluminescent display device of claim 17, further comprising one or more light-scattering layers disposed between the cover glass and the emission areas.

19. The electroluminescent display device of claim 18, wherein the one or more light-scattering layers contain a plurality of light-scattering particles increasing an out-coupling efficiency of the light emitted from the emission areas.

20. The electroluminescent display device of claim 18, wherein the light-scattering layers further comprise an adhesive material.

\* \* \* \* \*